(12) United States Patent
Loew et al.

(10) Patent No.: US 10,844,997 B1
(45) Date of Patent: Nov. 24, 2020

(54) DEVICE MOUNTING ASSEMBLY

(71) Applicant: AMAZON TECHNOLOGIES, INC., Seattle, WA (US)

(72) Inventors: Christopher Loew, Palo Alto, CA (US); Matthew J. England, Santa Monica, CA (US)

(73) Assignee: Amazon Technologies, Inc., Seattle, WA (US)

( * ) Notice: Subject to any disclaimer, the term of this patent is extended or adjusted under 35 U.S.C. 154(b) by 0 days.

(21) Appl. No.: 16/239,268

(22) Filed: Jan. 3, 2019

Related U.S. Application Data

(60) Provisional application No. 62/615,407, filed on Jan. 9, 2018, provisional application No. 62/614,980, filed on Jan. 8, 2018.

(51) Int. Cl.
| | |
|---|---|
| *F16M 11/14* | (2006.01) |
| *F16M 13/02* | (2006.01) |
| *H05K 7/16* | (2006.01) |
| *G03B 17/56* | (2006.01) |
| *G08B 13/196* | (2006.01) |

(52) U.S. Cl.
CPC ............ *F16M 11/14* (2013.01); *F16M 13/02* (2013.01); *G03B 17/561* (2013.01); *H05K 7/16* (2013.01); *F16M 2200/06* (2013.01); *F16M 2200/08* (2013.01); *G08B 13/19632* (2013.01)

(58) Field of Classification Search
CPC .... F16M 11/14; F16M 13/02; F16M 2200/06; F16M 2200/08; G03B 17/561; H05K 7/16; G08B 13/19632
USPC .. 248/121, 124.2, 155.2, 213.1, 447.1, 48.2, 248/231.91, 346.5
See application file for complete search history.

(56) References Cited

U.S. PATENT DOCUMENTS

| | | | | |
|---|---|---|---|---|
| 3,747,884 | A * | 7/1973 | Steisslinger | F16M 13/00 248/181.1 |
| 5,497,214 | A * | 3/1996 | Labree | F16M 11/08 248/187.1 |
| 7,959,120 | B2 * | 6/2011 | Liao | B60R 11/0252 248/278.1 |
| D865,842 | S * | 11/2019 | Siminoff | D16/203 |
| D866,633 | S * | 11/2019 | Siminoff | D16/203 |
| 2007/0170330 | A1 * | 7/2007 | Yeh | F16M 11/14 248/309.1 |
| 2007/0278366 | A1 * | 12/2007 | McGill | F16M 11/14 248/176.3 |
| 2018/0187828 | A1 * | 7/2018 | Law | F16M 13/02 |

* cited by examiner

*Primary Examiner* — Muhammad Ijaz
(74) *Attorney, Agent, or Firm* — Lathrop GPM LLP

(57) ABSTRACT

A device mounting assembly includes a baseplate and a support arm. The support arm may couple with a device. The support arm is pivotable with respect to the baseplate about the hinge to define a plurality of mounting assembly configurations. In at least one configuration, the support arm is located in at least one groove of a first surface on a first side of the baseplate.

19 Claims, 17 Drawing Sheets

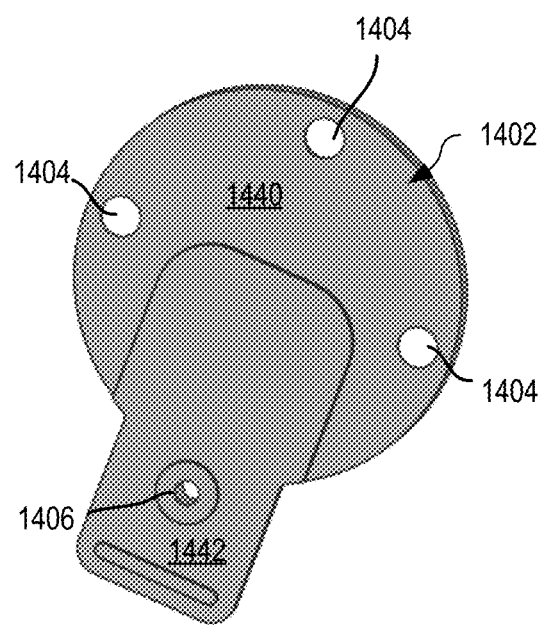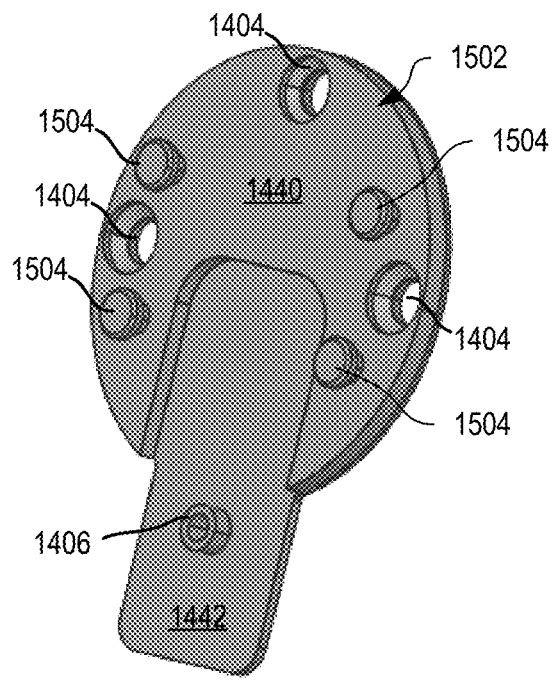
*Figure 14*     *Figure 15*

US 10,844,997 B1

DEVICE MOUNTING ASSEMBLY

CROSS-REFERENCE TO RELATED APPLICATIONS

This application benefits from and claims priority to U.S. Provisional Application Ser. No. 62/614,980, filed on Jan. 8, 2018, and U.S. Provisional Application Ser. No. 62/615,407, filed on Jan. 9, 2018. Each of the aforementioned applications are incorporated by reference in their entireties herein.

BRIEF DESCRIPTION OF THE FIGURES

FIG. 14 is a perspective view showing a back surface of the mounting plate of the camera assembly of FIG. 8, in embodiments;

FIG. 15 is a perspective view showing a front surface of the mounting plate of the camera assembly of FIG. 8, in embodiments;

DETAILED DESCRIPTION OF THE EMBODIMENTS

One aspect of the present embodiments includes the realization that existing security device assemblies, including security cameras, are not versatile enough for mounting on any surface, because they must be mounted in specific positions. Therefore, it is difficult to mount the camera, or other security devices (such as motion detectors, lights, alarm speakers, etc.), with an appropriate field of view and/or mounting position on any one of a ceiling, a wall, a tabletop, or another surface. The present embodiments solve this problem by providing a mounting bracket for use with a security device, where the mounting bracket includes a plate hinged with a mounting arm coupling the mounting bracket to a housing of the security device. Advantageously, the mounting bracket allows the security device assembly to be configured for mounting to any surface, including a ceiling, a wall, and a tabletop at the desired mounting position.

Figure 1:
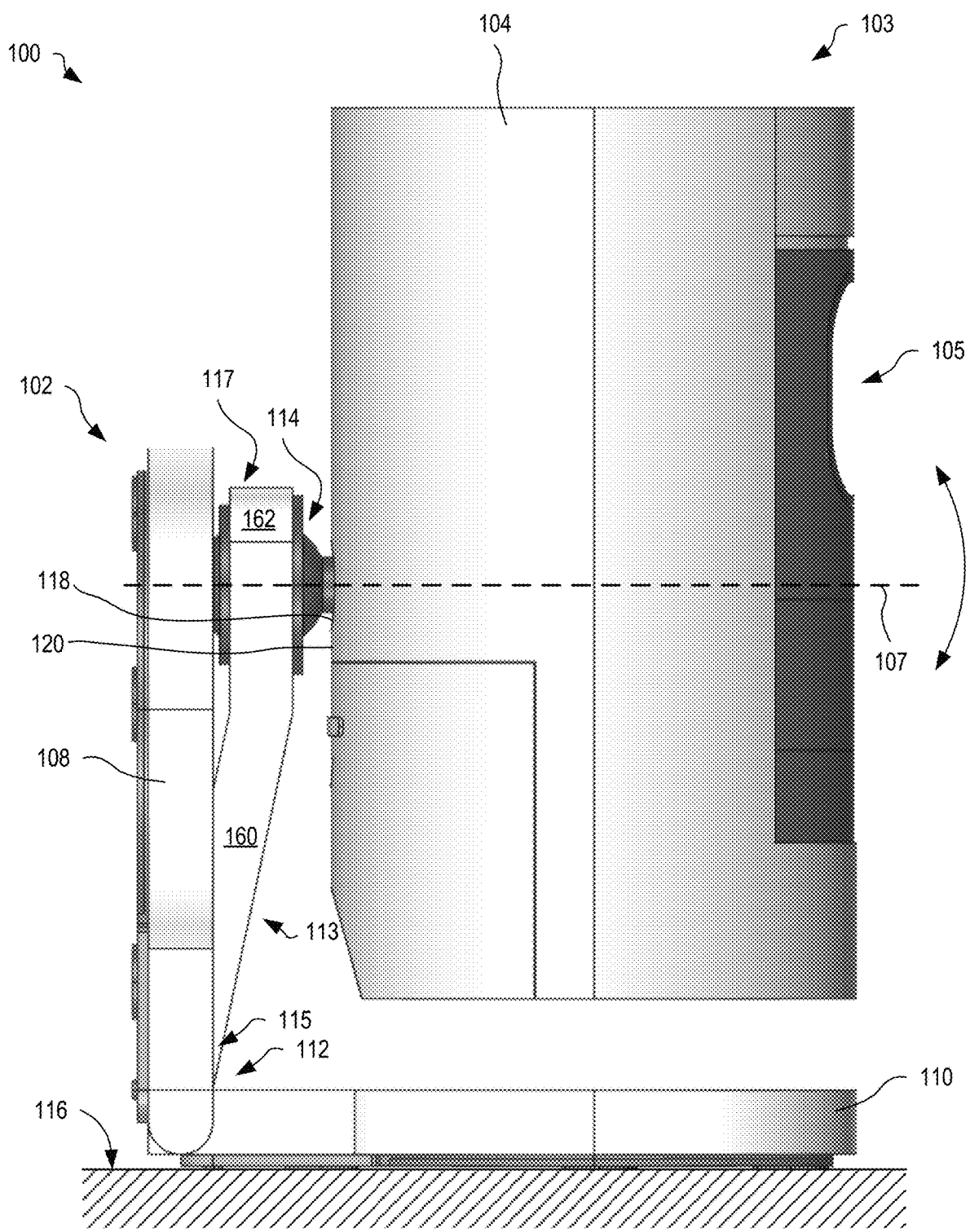
FIG. 1 is a side elevation view illustrating one example camera assembly with a configurable mounting bracket in a first configuration mounted to an upward facing surface, in an embodiment.
Figure 2:
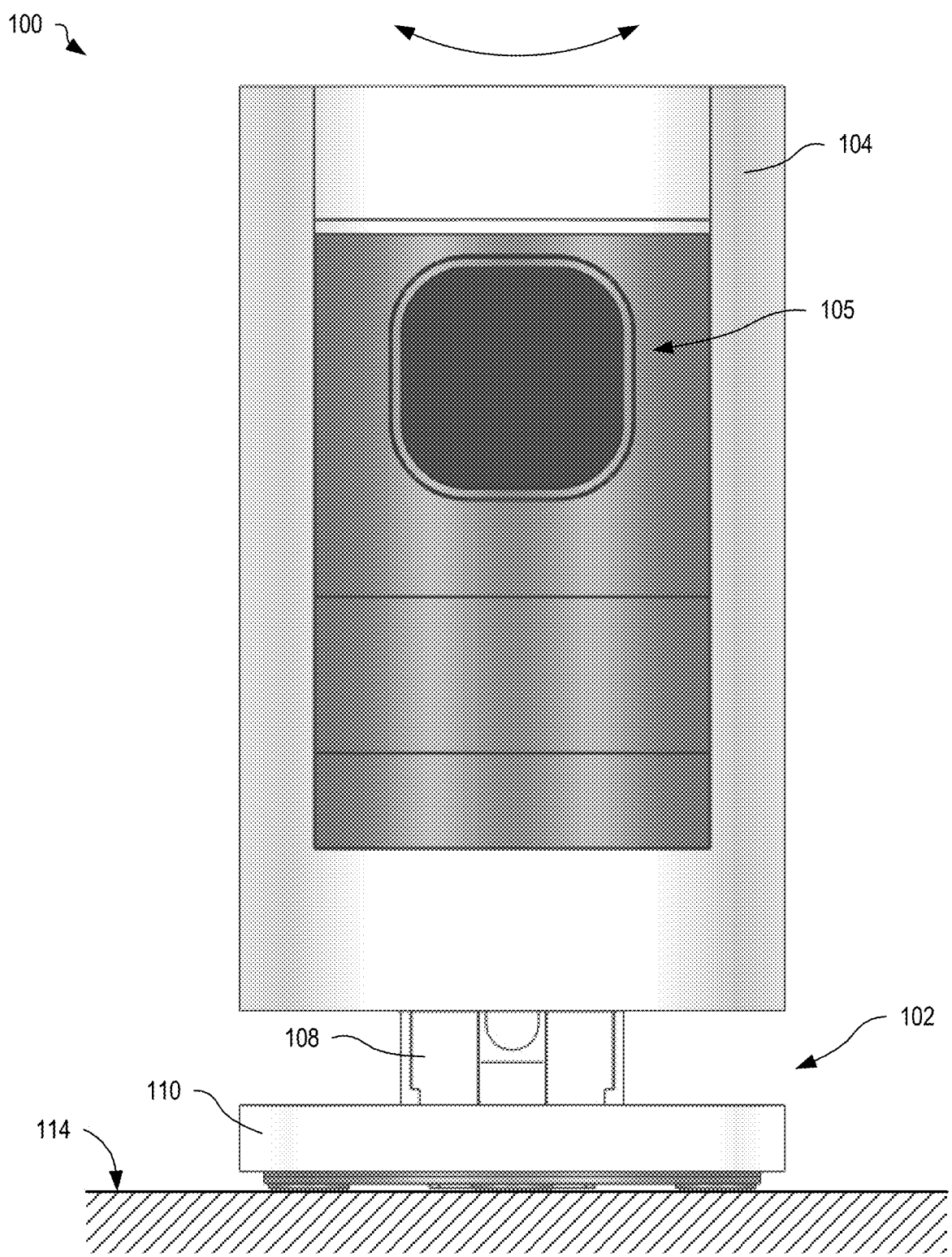
FIG. 2 is a front elevation view of the camera assembly of FIG. 1 in the first configuration.
Figure 3:
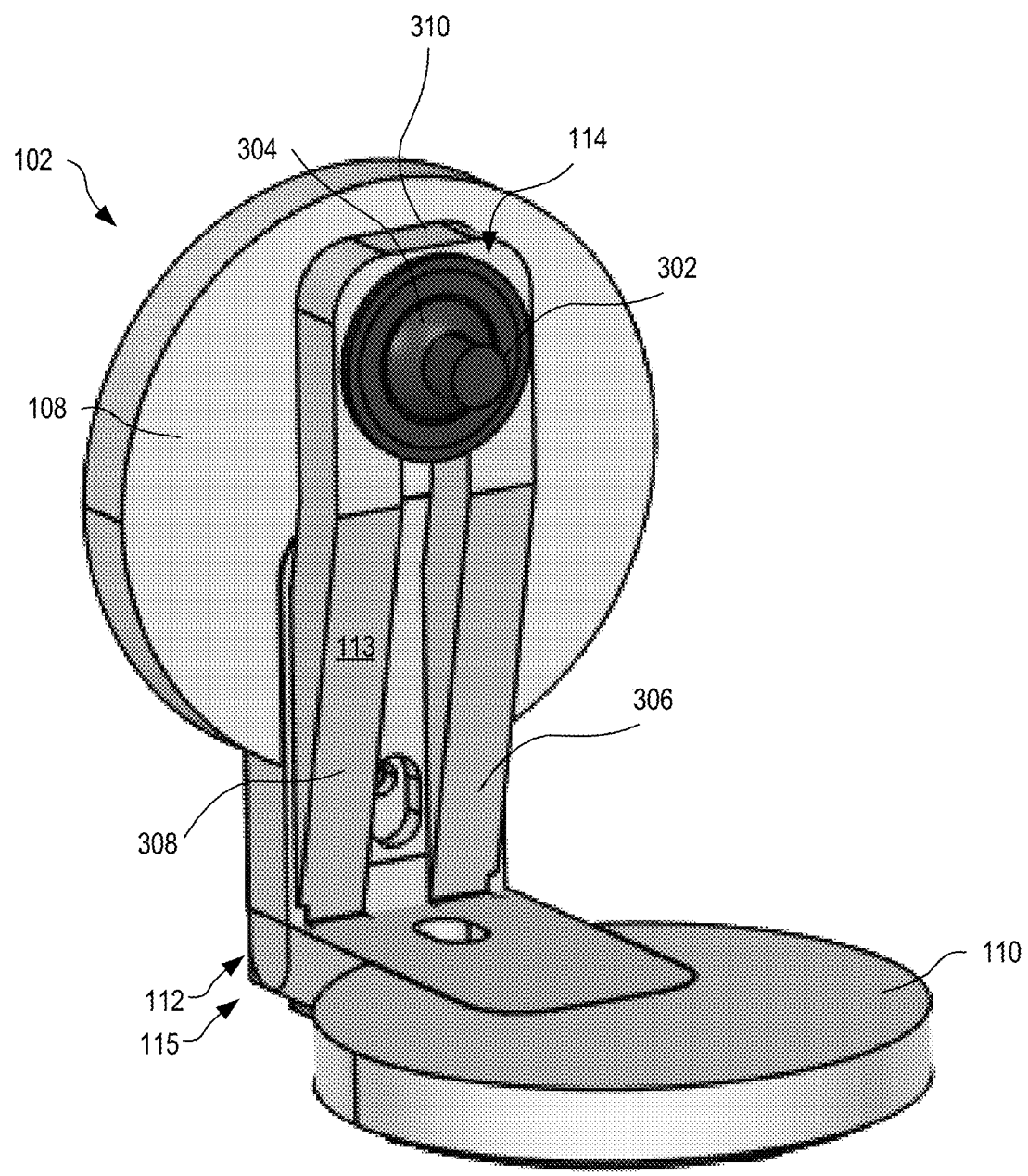
FIG. 3 is a front perspective view of the configurable mounting bracket of FIG. 1 without the camera housing attached thereto.

FIG. 1 is a side elevation view illustrating one example security device assembly 100 with a configurable mounting bracket 102 in a first configuration mounted to an upward facing surface 116 (e.g., a tabletop, a floor, a windowsill, etc.). FIG. 2 is a front elevation view of the security device assembly 100 of FIG. 1 in the first configuration. FIG. 3 is a front perspective view of the configurable mounting bracket 102 without the camera housing 104 attached thereto. FIGS. 1-3 are best viewed together with the following description.

The security device assembly 100 includes the configurable mounting bracket 102 coupled with a security device 103. The security device 103 is shown as a camera including a camera housing 104 having a camera 105 and attaching to the configurable mounting bracket 102 with a ball-and-socket joint 114. In embodiments, the configurable mounting bracket 102 may couple to additional or alternative security devices other than a camera, such as but not limited to one or more floodlights, speakers, motion detectors, glass-break sensors, home security devices, and home automation devices. The configurable mounting bracket 102 has a first plate 108 (e.g., a back plate) coupled with a second plate 110 (e.g. a baseplate) that articulates at any angle about a hinge 112 and be retained at continuous angles between the first and second configurations. In other words, the hinge 112 is configured to retain a support arm 113 at any angle that the support arm 113 is positioned to with respect to the first plate 108 and second plate 110. One or both of the first plate 108 and the second plate 110 may couple to a surface, such as the surface 116 (or any other surface discussed herein, e.g. the surface 416, the surface 516), as discussed below. The ball-and-socket joint 114 enables configurable movement of the camera housing 104 with respect to the configurable mounting bracket 102 for directing a field-of-view of the camera 105. The ball-and-socket joint 114 also enables the configurable mounting bracket 102 to pivot 360-degrees about a horizontal axis 107 (relative to the orientation of the configurable mounting bracket 102 depicted in FIG. 1) passing through the ball-and-socket joint 114.

The ball-and-socket joint 114 is attached at an end of a support arm 113 that extends from the first plate 108 at hinge 112. In embodiments, the support arm 113 is not straight, but instead bends from the ball-and-socket 114 toward the hinge 112 such that the camera housing 104 may be angled via the ball-and-socket 114 without interference by the support arm 113. In other words, the support arm 113 includes a first portion 160 and a second portion 162 that is located at a non-parallel angle with respect to the first portion 160, wherein the ball-and-socket 114 is located at the second portion 162. In embodiments, the support arm 113 is independently pivotable with respect to one or both of the first plate 108 and the second plate 110. In embodiments, the support arm 113 is coupled to the hinge 112 at a first end 115 (located at the first portion 160), and the ball-and-socket joint 114 is located at a second end 117 (located at the second portion 162). In embodiments, the second end 117 is bent with respect to the first end 115. In embodiments, the support arm 113 is coupled to the hinge 112 via a pin (not shown) extending through the support arm 113 at the first end 115. As shown in FIG. 3, in embodiments, the support arm includes a first support arm portion 306 and a second support arm portion 308 each coupled to the baseplate 808 at the first end 115 via the hinge 112. Furthermore, the support arm 113 includes a connecting portion 310 connecting the first support arm portion 306 to the second support arm portion 308 at the second end 117. The ball-and-socket joint 114 is located between the first support arm portion 306 and the second support arm portion 308.

Figure 4:
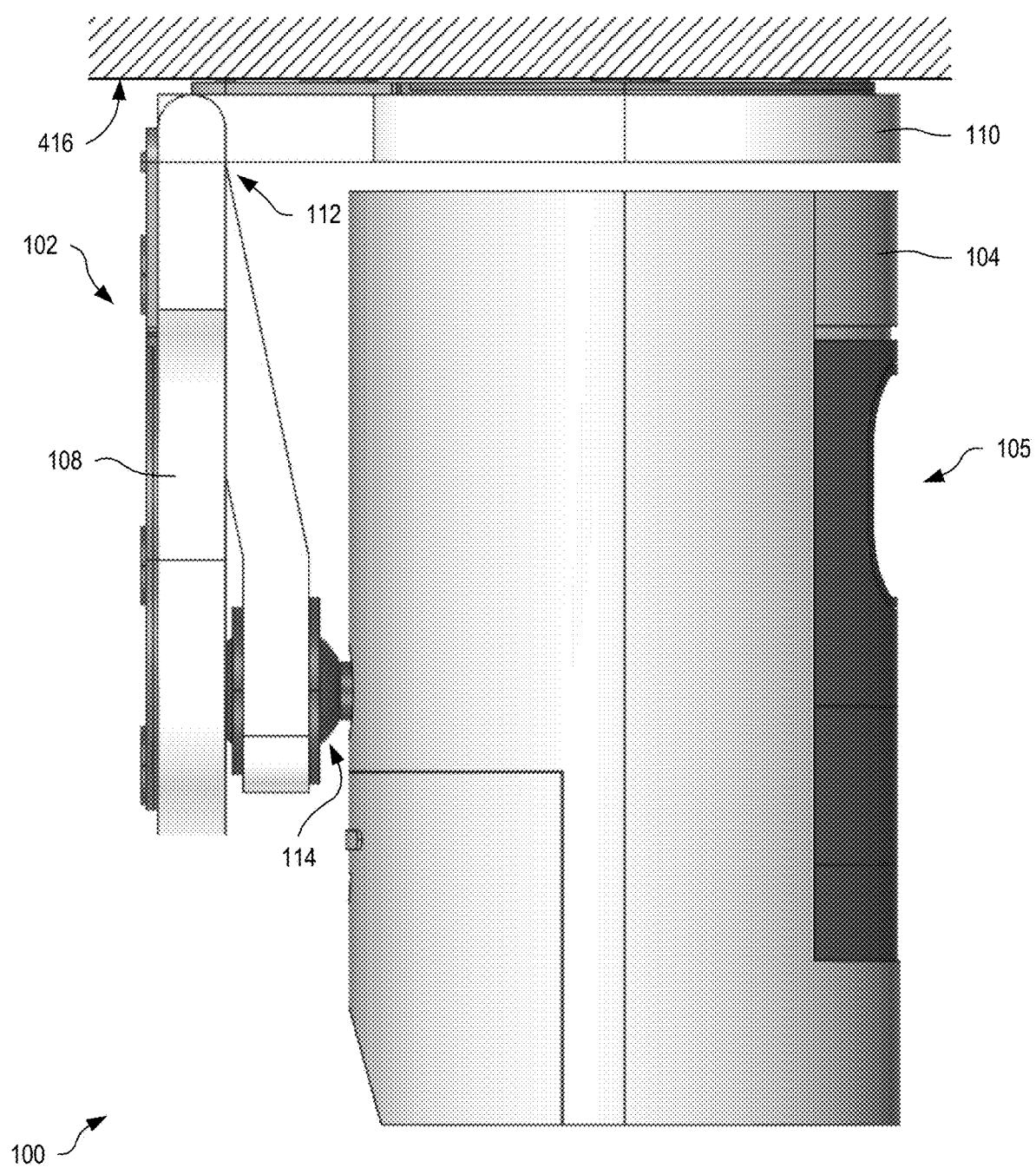
FIG. 4 is a side elevation view of the camera assembly of FIG. 1 with the configurable mounting bracket in a second configuration mounted to a downward facing surface.

FIG. 4 is a side elevation view of the security device assembly 100 of FIG. 1 with the configurable mounting bracket 102 pivoted 180-degrees from the first configuration into a second configuration mounted to a downward facing surface 416 (e.g., a ceiling, a soffit, etc.). In this second configuration, the second plate 110 is positioned above the camera housing 104 and may be attached to the downward facing surface 416.

Figure 4A:
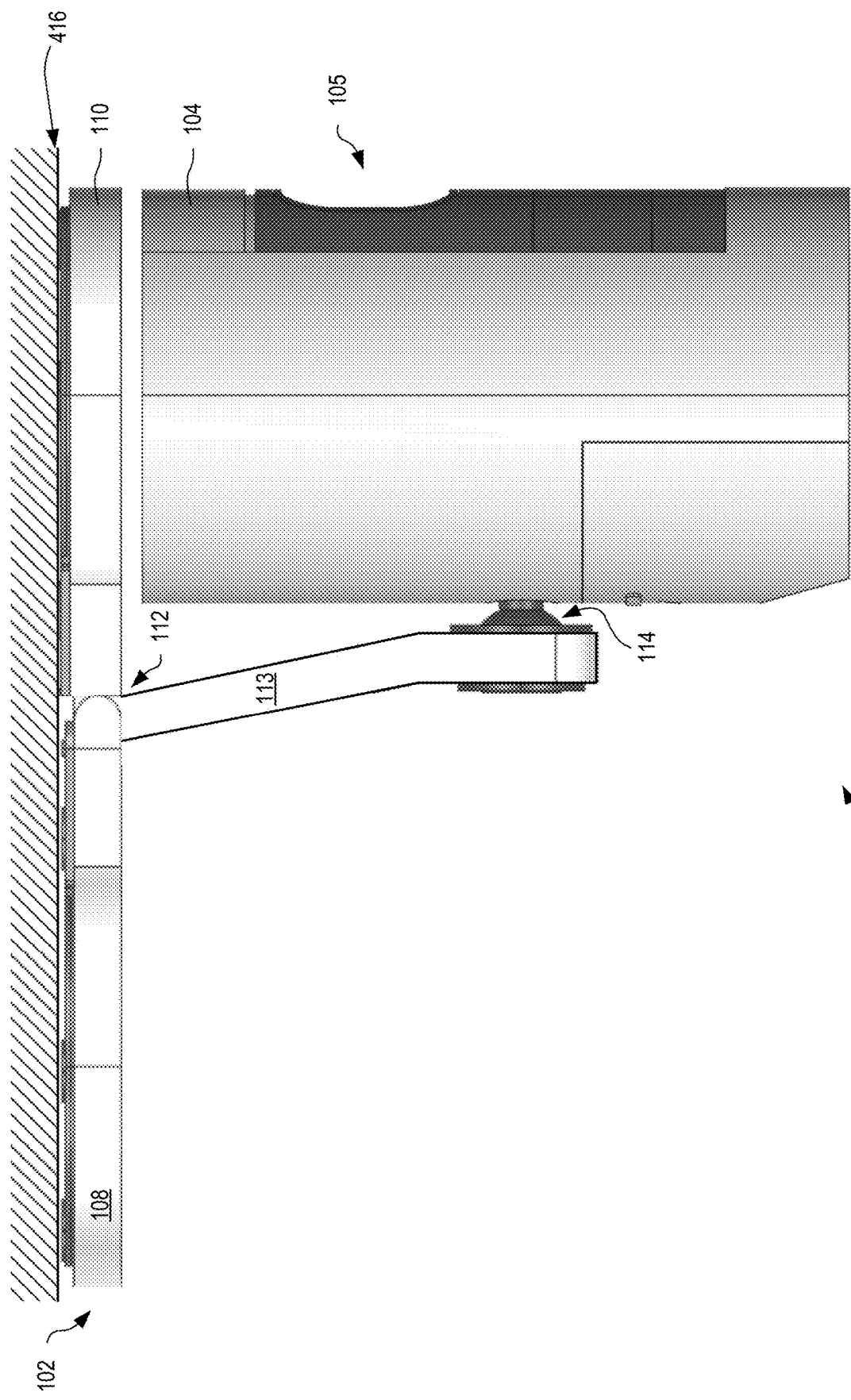
FIG. 4A is a side elevation view of the camera assembly of FIG. 1 with the configurable mounting bracket in a second configuration mounted to a downward facing surface with the support arm independently pivoted with respect to both plates.

FIG. 4A is a side elevation view of the security device assembly 100 of FIG. 1 with the configurable mounting bracket 102 pivoted 180-degrees from the first configuration into a second configuration mounted to a downward facing surface 416 (e.g., a ceiling, a soffit, etc.). In this second configuration, the second plate 110 is positioned above the camera housing 104 and may be attached to the downward facing surface 416. In this second configuration, the first plate 108 is also mounted to the downward facing surface 416, and is in the same plane as the second plate 110. Also in this second configuration, the support arm 413 is independently pivoted with respect to both of the first plate 108 and the second plate 110 such that the camera housing 104 is mounted to the support arm 113 and below the plane defined by the first plate 108 and the second plate 110.

Figure 5:
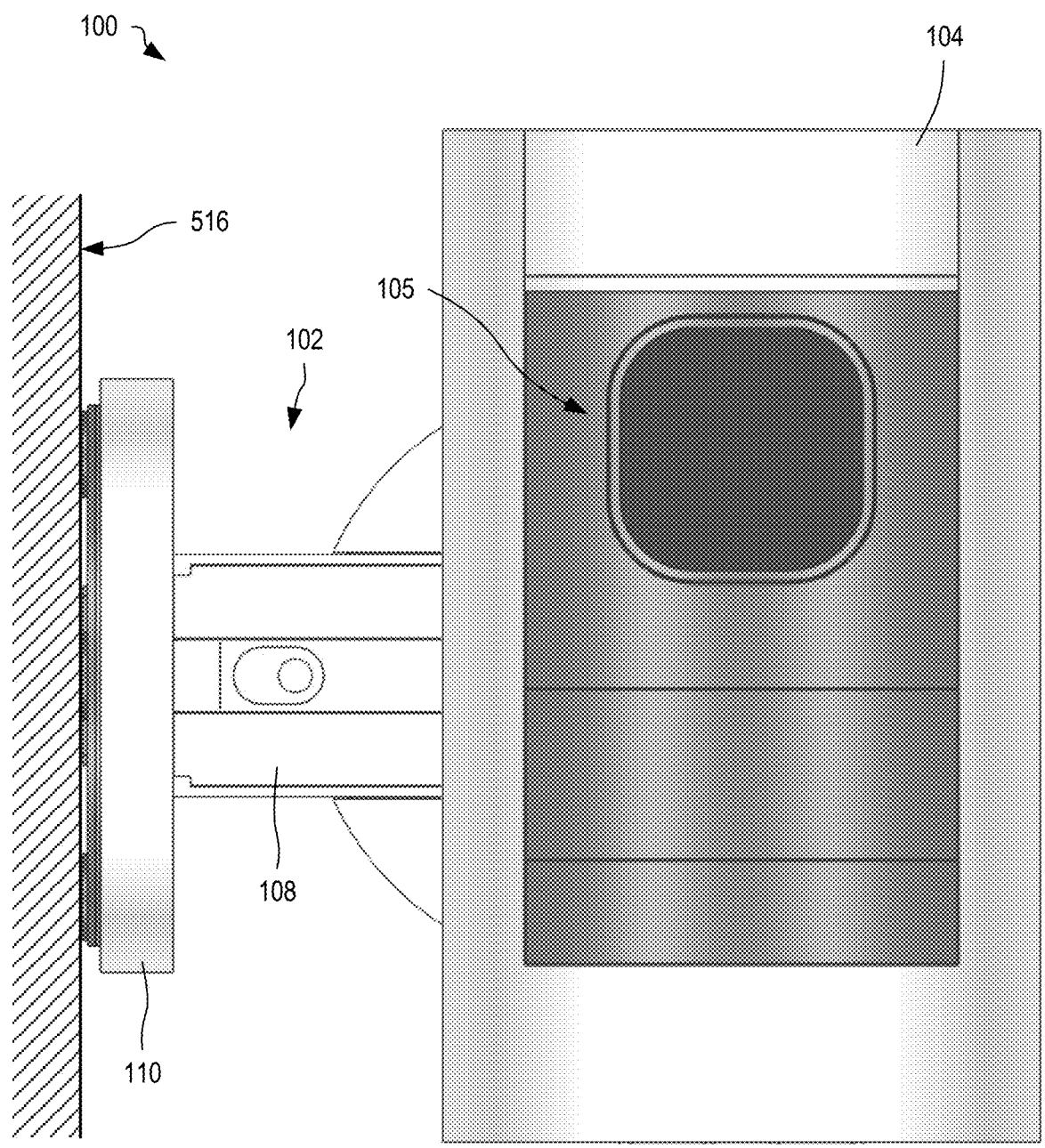
FIG. 5 is a front elevation view of the camera assembly of FIG. 1 with the configurable mounting bracket in a third configuration mounted to a sideways facing surface.

FIG. 5 is a front elevation view of the security device assembly 100 of FIG. 1 with the configurable mounting bracket 102 in a third configuration mounted to a sideways facing surface 516 (e.g., a vertical wall, a post, a door, or another similar surface). In this third configuration, configurable mounting bracket 102 is pivoted 90-degrees from the first configuration of FIG. 1 and the second plate is positioned to the side of the camera housing 104 to facilitate attachment of the mounting bracket to the sideways facing surface 516. One example of use of the third configuration is for positioning the camera assembly near a corner of a wall or structure, such that a field-of-view of the camera 105 extends at least partially around the corner.

Figure 6:
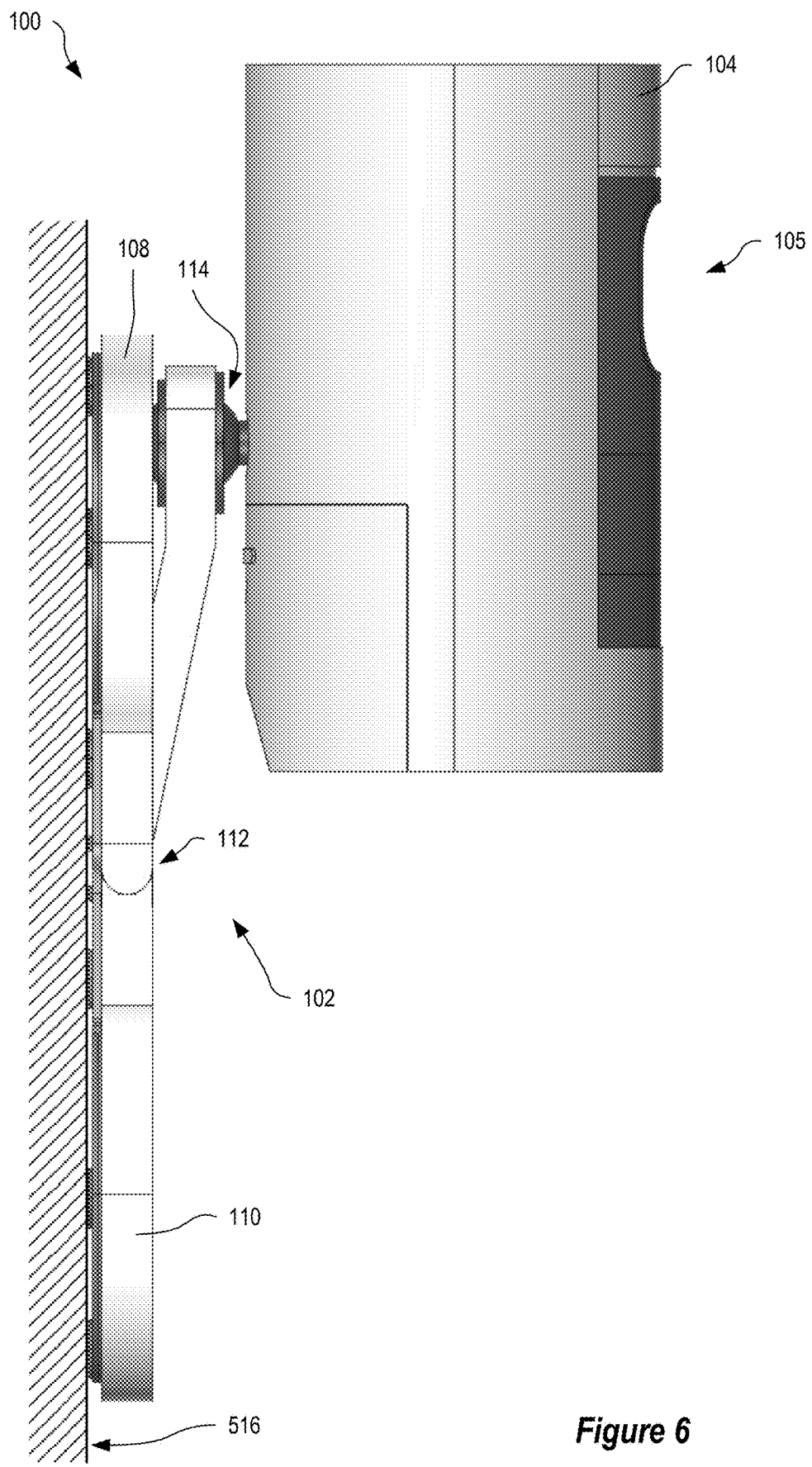
FIG. 6 is a side elevation view of the camera assembly of FIG. 1 with the configurable mounting bracket in a fourth configuration mounted to the sideways facing surface of FIG. 5.
Figure 7:
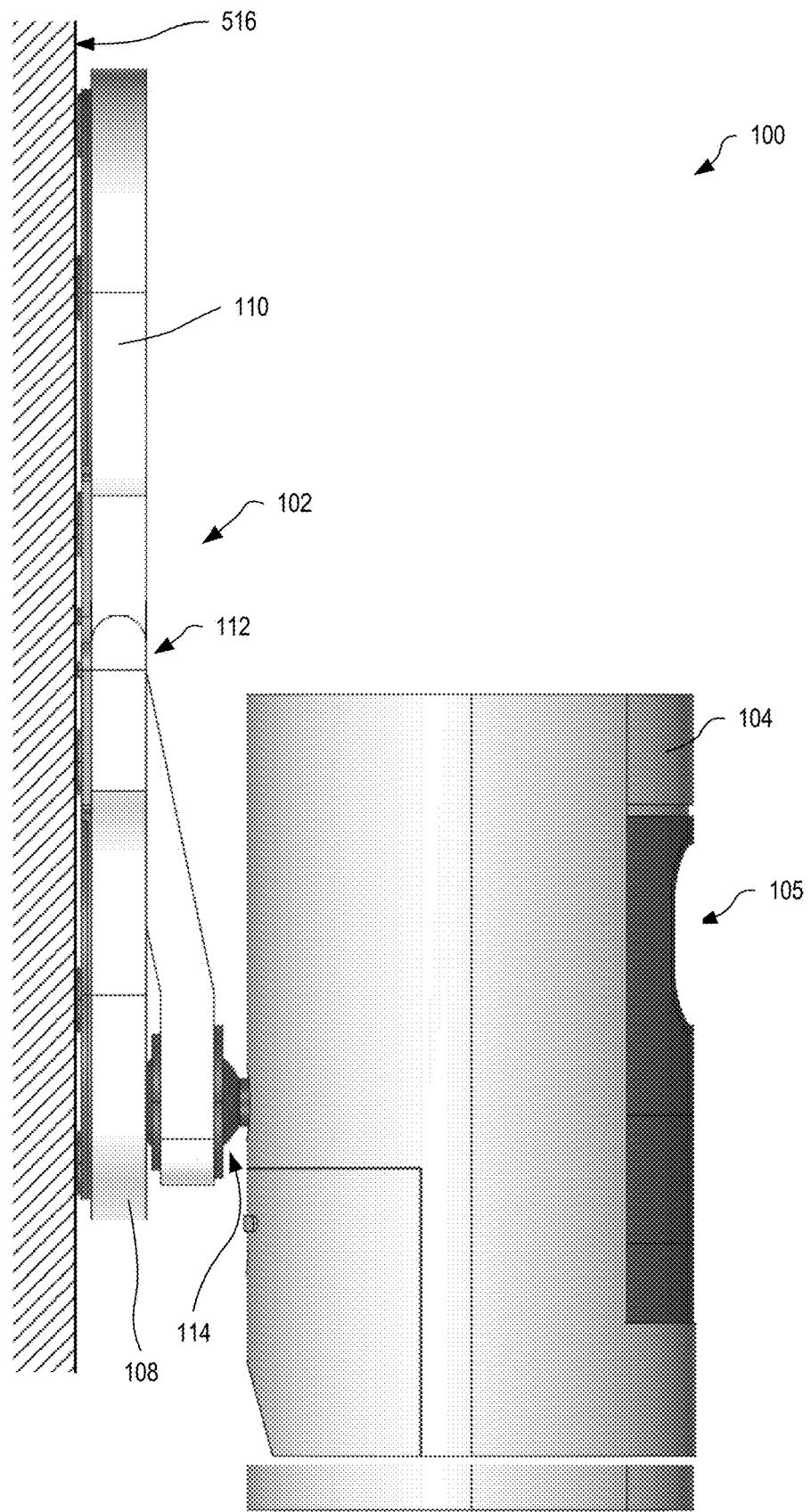
FIG. 7 is a side elevation view of the camera assembly of FIG. 1 with the configurable mounting bracket in a fifth configuration mounted to the sideways facing surface of FIG. 5.

FIG. 6 is a side elevation view of the security device assembly 100 of FIG. 1 with the configurable mounting bracket 102 in a fourth configuration mounted to the sideways facing surface 516 of FIG. 5. FIG. 7 is a side elevation view of the security device assembly 100 of FIG. 1 with the configurable mounting bracket 102 in a fifth configuration mounted to the sideways facing surface 516 of FIG. 5. In the fourth and fifth configurations, the hinge 112 is opened, from the 90-degree position of FIGS. 1-4, to a 180-degree position, such that the first plate 108 and the second plate 110 are aligned to the same plane. In the fourth configuration (FIG. 6), the second plate 110 is positioned below the first plate 108 and further enables the security device assembly 100 to be mounted on the sideways facing surface 516 with the camera housing 104 positioned closer to the sideways facing surface 516 as compared to the third configuration of FIG. 5. In the fifth configuration (FIG. 7), the second plate 110 is positioned above the first plate 108 and enables the security device assembly 100 to be mounted on the sideways facing surface 516 with the camera housing 104 positioned closer to the sideways facing surface 516 as compared to the third configuration of FIG. 5. The configurable mounting bracket 102 is rotatable to any angle, relative to the camera housing 104, for attaching to the sideways facing surface 516. The security device assembly 100 is thus able to be mounted on virtually any surface desired.

The second plate 110 and/or the first plate 108 includes one or more mounting holes configured to receive fastening members (e.g., screws, bolts, etc.) to facilitate mounting of the security device assembly 100 to a surface.

In embodiments, the security device assembly 100 includes a power source (not shown) for powering the camera 105 (and any other powered components of the security device assembly 100). In one embodiment, the power source is a rechargeable and/or replaceable battery configured within the camera housing 104. In another embodiment, the power source (e.g., a mains powered adaptor) is external to the camera housing 104 and coupled thereto via a wire or cable.

In one example of operation, the configurable mounting bracket 102 is positioned in the first configuration of FIGS. 1 and 2 and the security device assembly 100 is mounted on a tabletop. In another example of operation, the configurable mounting bracket 102 is manipulated into the second configuration of FIG. 4 (e.g., rotated 180-degrees from the first configuration) and the security device assembly 100 is suspended from a ceiling. In another example of operation, with the configurable mounting bracket 102 manipulated into one of the third, fourth, or fifth configurations of FIGS. 5, 6, and 7, respectively, the security device assembly 100 is mounted on a vertical wall.

With reference to FIG. 3, a post 302 extends from the ball portion 304 of the ball-and-socket joint 114. The post 302 is received in a mating opening 118 in a rear surface 120 of the camera housing 104, as shown in FIG. 1. In some embodiments, the camera housing 104 is readily separable from the configurable mounting bracket 102 by disengaging the post 302 from the mating opening 118. For example, in embodiments, the post 302 includes an external (male) thread and the mating opening 118 includes an internal (female) thread. By detaching the camera housing 104 from the configurable mounting bracket 102, a user may attach the camera housing 104 to another mounting/positioning apparatus, such as a tripod (not shown). The separability of the camera housing 104 from the configurable mounting bracket 102 thus further enhances the versatility of the present security device assembly 100.

Figure 8:
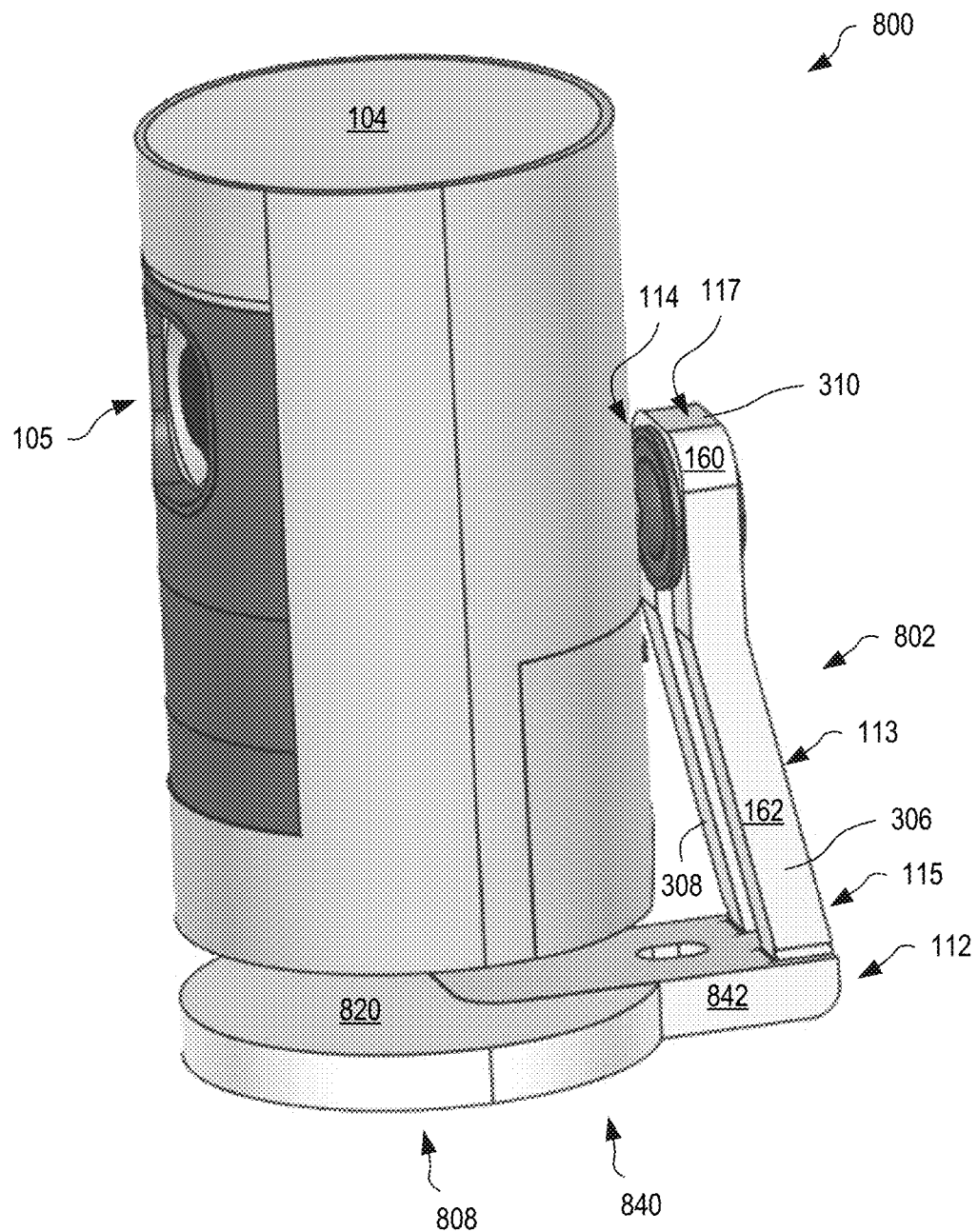
FIG. 8 is a top front perspective view illustrating another example camera assembly with a configurable mounting bracket in a first configuration for mounting to an upward facing surface (e.g., a tabletop, a floor, a windowsill, etc.), in embodiments.
Figure 9:
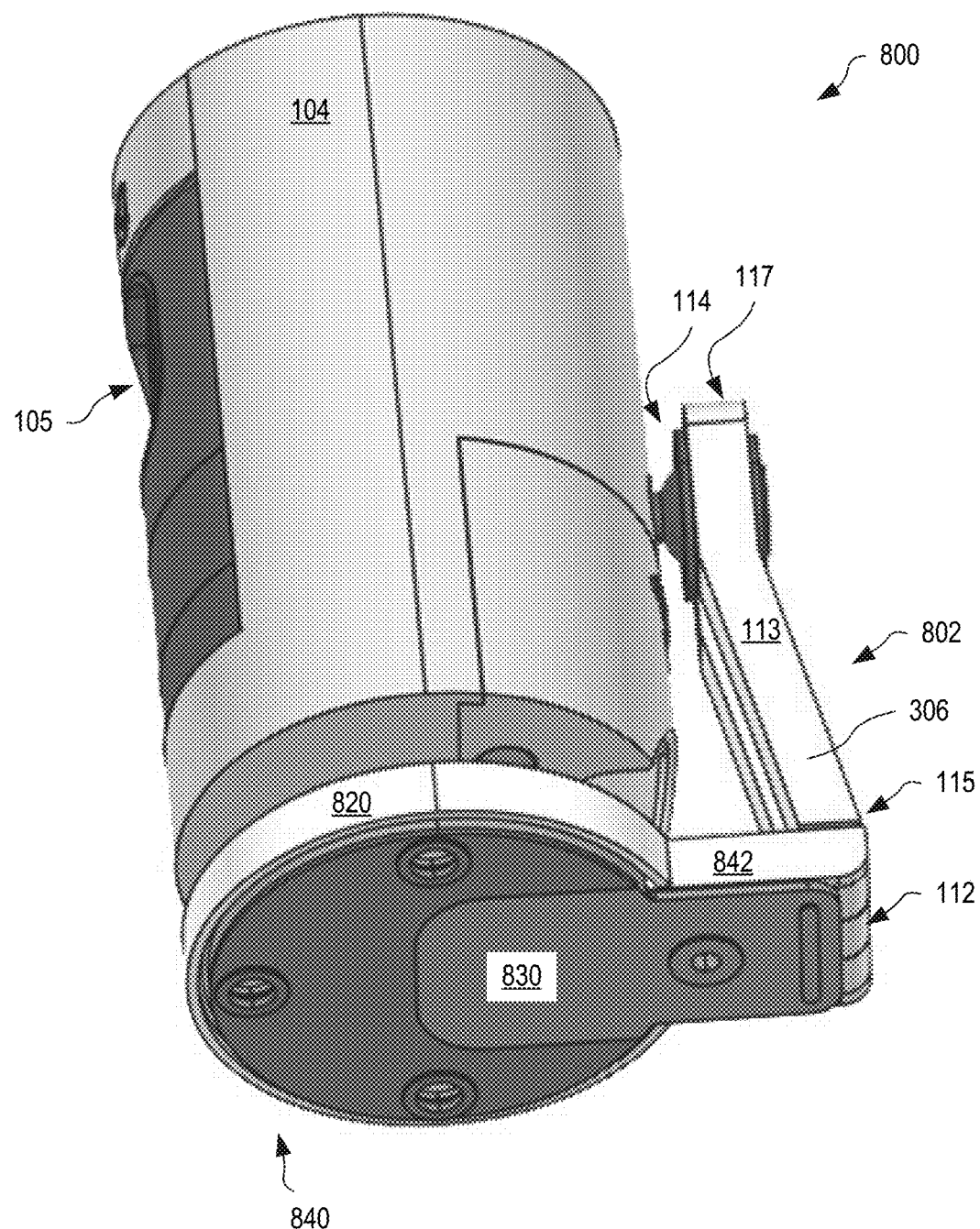
FIG. 9 is a bottom perspective view of the camera assembly of FIG. 8 in the first configuration.
Figure 10:
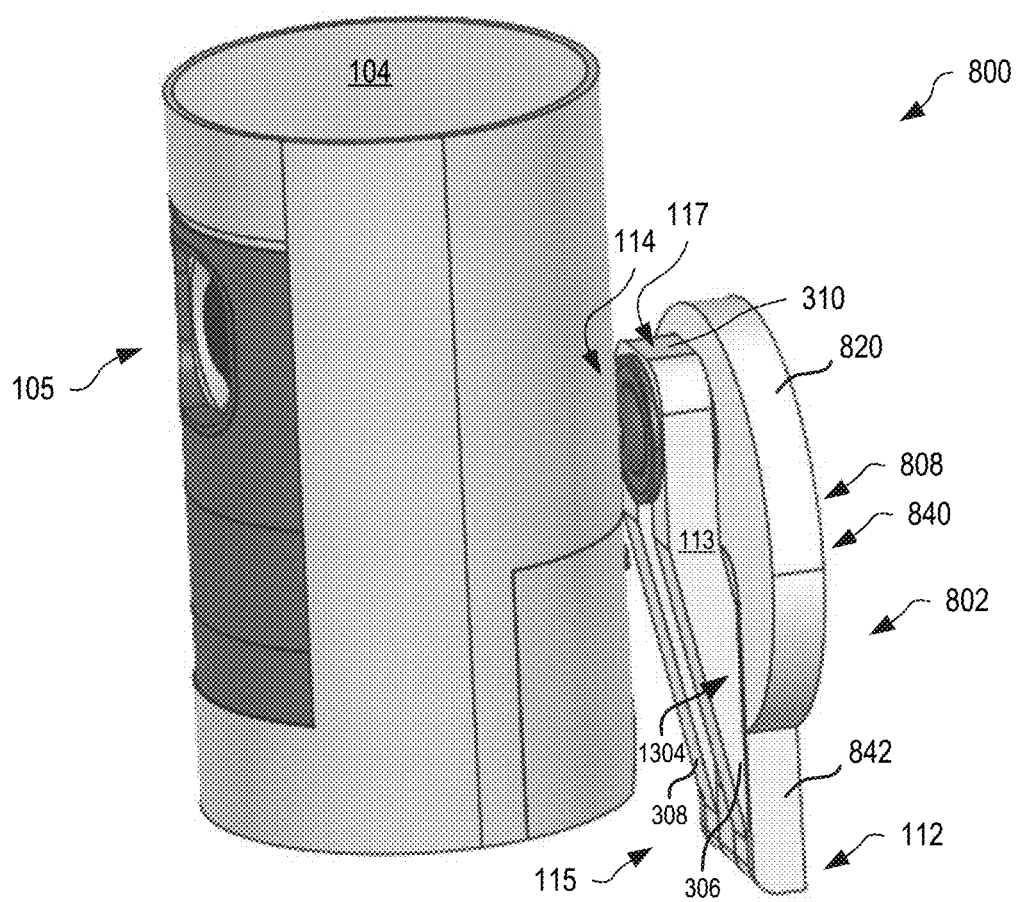
FIG. 10 is a front perspective view of the camera assembly of FIG. 8 in a second configuration for mounting to a vertical surface (e.g., a vertical wall, a post, a door, or another similar surface)
Figure 11:
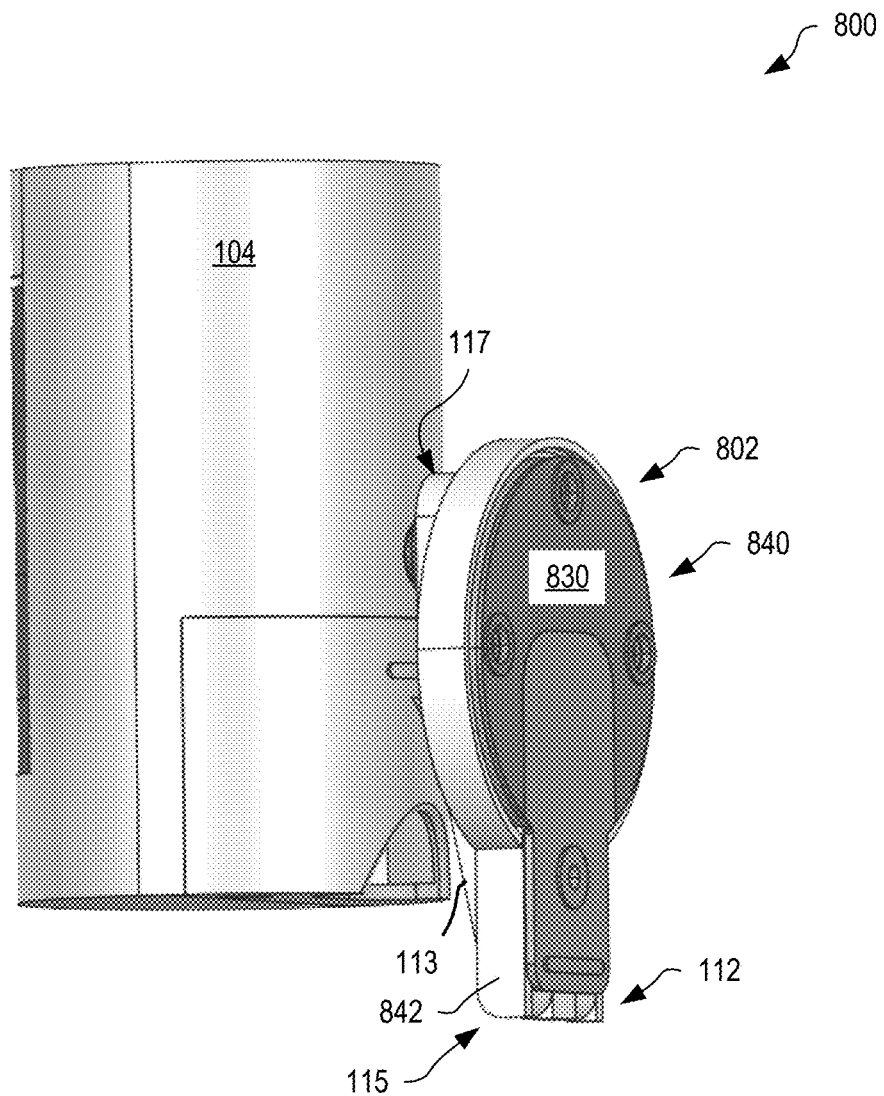
FIG. 11 is a rear perspective view of the camera assembly of FIG. 8 in the second configuration.
Figure 12:
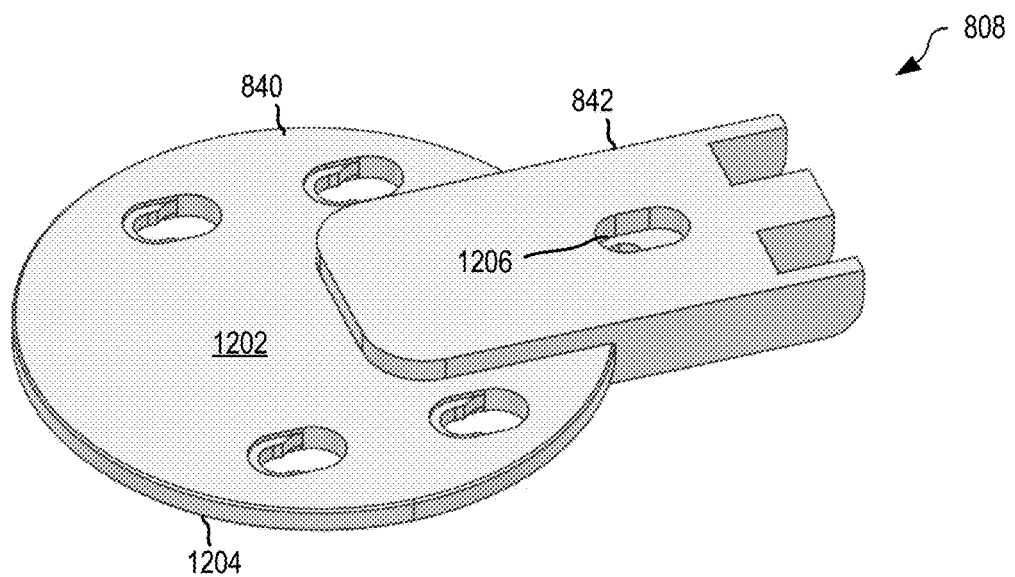
FIG. 12 is a perspective view of the plate of the camera assembly of FIG. 8 showing a first side of the configurable mounting bracket, in embodiments.
Figure 13:
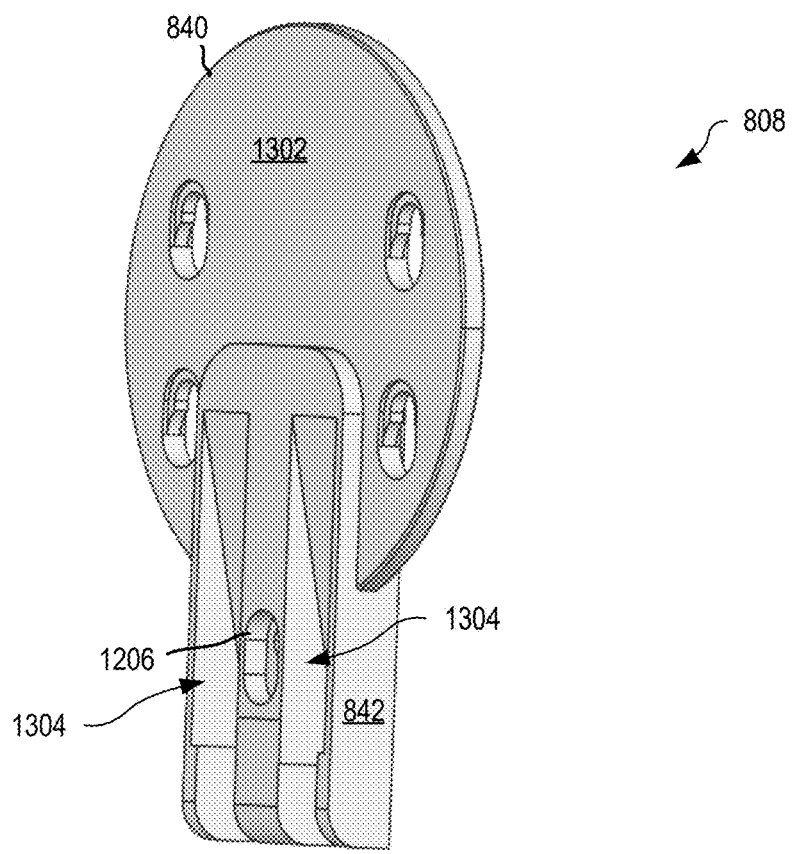
FIG. 13 is a perspective view of the plate of the camera assembly of FIG. 8 showing a second side of configurable mounting bracket including the second surface, in embodiments.
Figure 16:
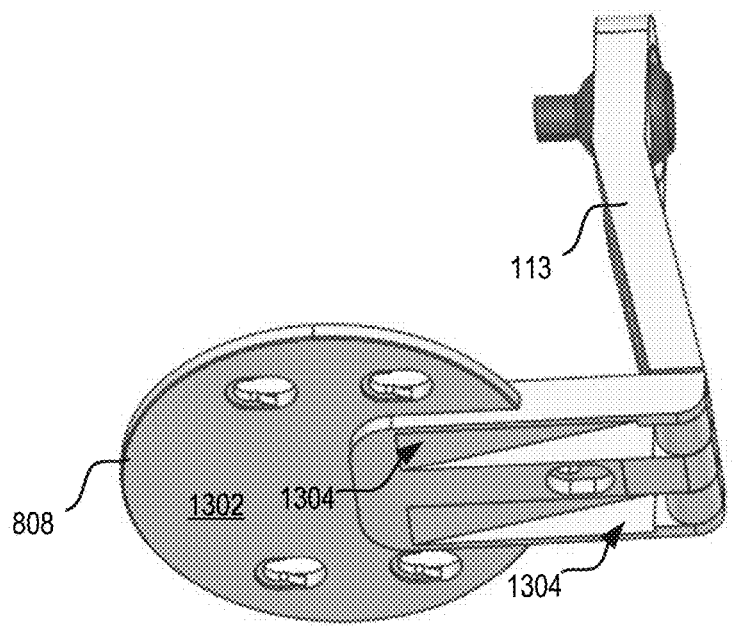
FIG. 16 is a perspective view of the plate and the support arm, of FIGS. 8-10, isolated in the first configuration.
Figure 17:
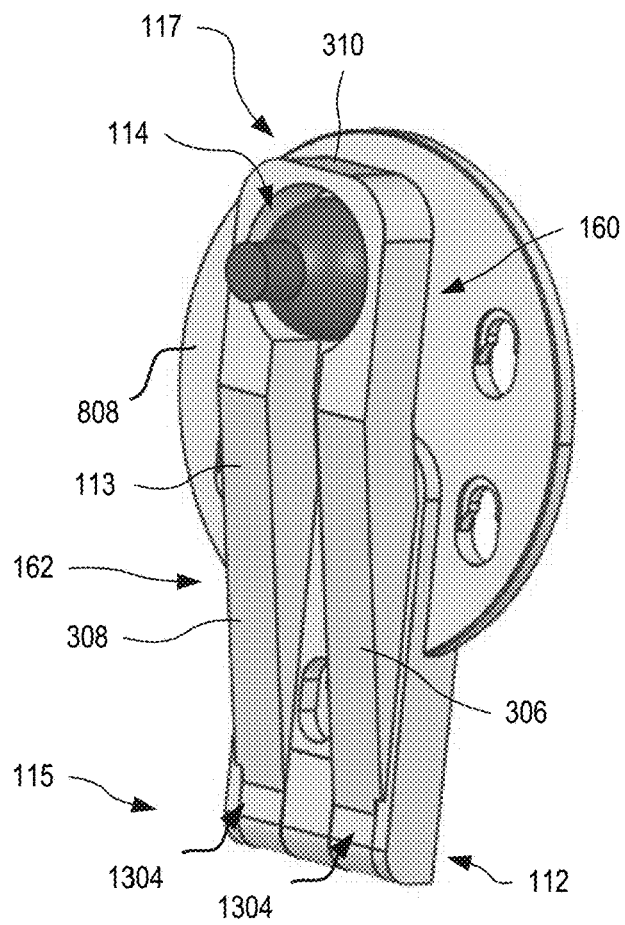
FIG. 17 is a perspective view of the plate and the support arm, of FIGS. 8-10, isolated in the second configuration.
Figure 18:
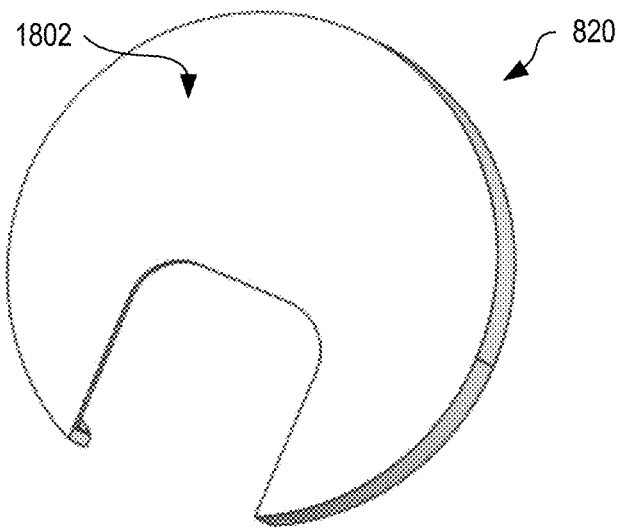
FIG. 18 is a perspective view of the front surface of the removable plate cover of the configurable mounting bracket isolated, in embodiments.
Figure 19:
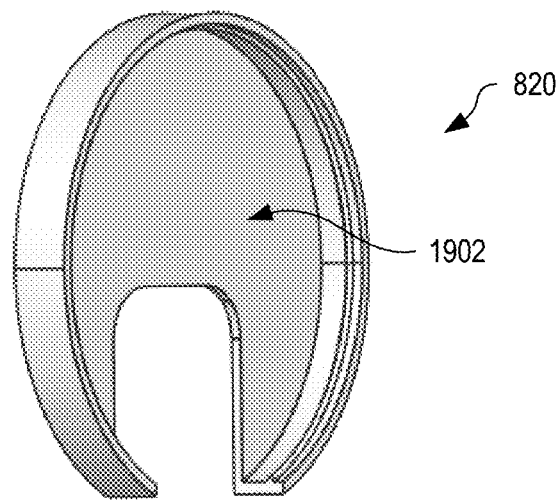
FIG. 19 is a perspective view of the back surface of the removable plate cover of the configurable mounting bracket isolated, in embodiments.
Figure 20:
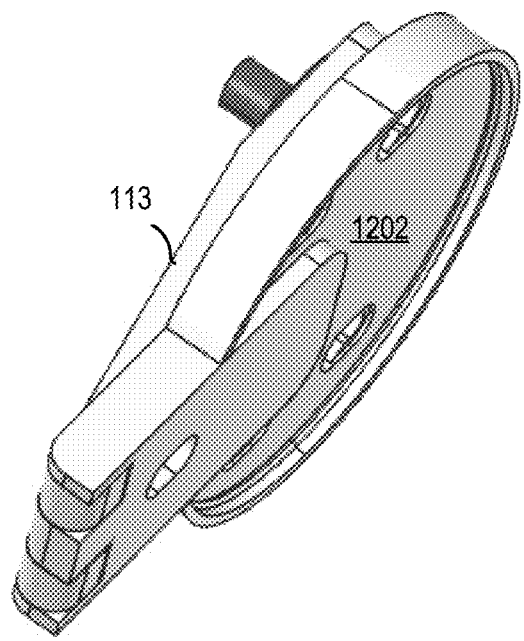
FIG. 20 is a perspective view of the removable plate cover coupled to the second side of the plate, in embodiments.
Figure 21:
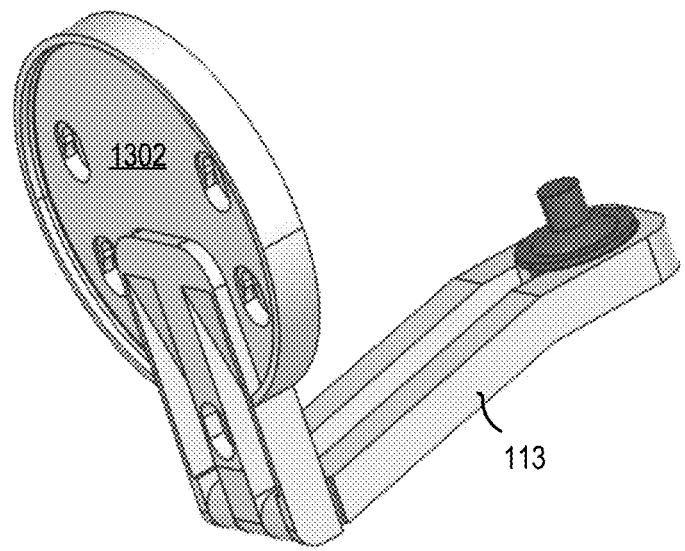
FIG. 21 is a perspective view of the removable plate cover coupled to the first side of the plate, in embodiments.

FIG. 8 is a top front perspective view illustrating another example security device assembly 800 with a configurable mounting bracket 802 in a first configuration for mounting to an upward facing surface (e.g., a tabletop, a floor, a windowsill, etc.), in embodiments. FIG. 9 is a bottom perspective view of the security device assembly 800 in the first configuration. FIG. 10 is a front perspective view of the security device assembly 800 in a second configuration for mounting to a vertical surface (e.g., a vertical wall, a post, a door, or another similar surface). FIG. 11 is a rear perspective view of the security device assembly 800 in the second configuration. FIG. 12 is a perspective view of a baseplate 808 showing a first side 1202 of the configurable mounting bracket 802, in embodiments. FIG. 13 is a perspective view of the baseplate 808 showing a second side 1302 of the configurable mounting bracket 802 including the second surface 822, in embodiments. FIG. 14 is a perspective view showing a back surface 1402 of the mounting plate 830, in embodiments. FIG. 15 is a perspective view showing a front surface 1502 of the mounting plate 830, in embodiments. FIG. 16 is a perspective view of the baseplate 808 and the support arm 113, of FIGS. 8-10, isolated in the first configuration. FIG. 17 is a perspective view of the baseplate 808 and the support arm 113, of FIGS. 8-10, isolated in the second configuration. FIG. 18 is a perspective view of a front surface 1802 of the removable plate cover 820 of the configurable mounting bracket 802 isolated, in embodiments. FIG. 19 is a perspective view of a back surface 1902 of the removable plate cover 820 of the configurable mounting bracket 802 isolated, in embodiments. FIG. 20 is a perspective view of the removable plate cover 820 coupled to the second side of the baseplate 808, in embodiments. FIG. 21 is a perspective view of the removable plate cover 820 coupled to the first side of the baseplate 808, in embodiments. FIGS. 8-21 are best viewed together with the following description.

The security device assembly 800 is similar to the security device assembly 100, except that the configurable mounting bracket 802 includes only a single baseplate 808. As such, the security device assembly 800 includes the camera housing 104 that includes a camera 105 and attaches to the configurable mounting bracket 802 with the ball-and-socket joint 114. In embodiments, the configurable mounting bracket 802 may couple to additional or alternative security devices other than a camera, such as but not limited to one or more floodlights, speakers, motion detectors, glass-break sensors, home security devices, and home automation devices. The ball-and-socket joint 114 is located at the second end 117 of the support arm 113, as discussed above. The first end 115 of the support arm 113 is coupled to the hinge 112, as discussed above.

The support arm 113 pivots about the hinge 112 at any angle with respect to the baseplate 808 and can be retained at continuous angles between the first configuration of FIG. 8 and second configuration of FIG. 10. In other words, the hinge 112 is configured to retain the support arm 113 at any angle at which the support arm 113 is positioned with respect to the baseplate 808. Comparing FIG. 8 to FIG. 10, the support arm 113 is rotated at least 270 degrees with respect to the baseplate between the first configuration shown in FIG. 8, and the second configuration shown in FIG. 10. In embodiments, a desired angle between the support arm 113 and the baseplate 808 is maintained with a friction engagement at the hinge 112, with detents within the hinge 112, etc. The configurable mounting bracket 802 includes a removable plate cover 820.

The configurable mounting bracket 802 may also mount to a mounting plate 830 (FIGS. 9 and 11) that mounts between to the surface to which the security device assembly 800 is to be secured and the baseplate 808. In embodiments, the mounting plate 830 is formed of a pliable material, such as silicon, that compresses when the configurable mounting bracket 802 is installed to create a moisture seal. With reference to FIG. 12, a flange or extension 842 of the baseplate 808 includes a plurality of receiving apertures 1204 for receiving fastener protrusions 1504 (FIG. 15) extending from the front surface 1502 of the mounting plate 830. Although there are four receiving apertures 1204 and four fastener protrusions 1504 illustrated, there may be more or fewer without departing from the scope hereof. Moreover, the baseplate 808 may secure to the mounting bracket 830 via additional and/or alternative fastening means, such as adhesive, hook-and-loop fastener, screws, nails, etc.

With reference to FIG. 13, the second side of the extension 842 includes one or more grooves 1304 that complement the shape of the support arm 113. There may be more or fewer grooves 1304 than shown in FIG. 13 depending on the shape of the support arm 113. As such, as shown in FIG. 16, as the support arm 113 pivots with respect to the baseplate 808, in the first configuration (shown in FIGS. 8-9), the support arm 113 is not within the grooves 1304, but instead above the first surface 1202. As the support arm 113 pivots with respect to the baseplate 808 in the second configuration (shown in FIGS. 10-11), the support arm 113 extends at least partially within the grooves 1304.

The support arm 113 includes a first portion 160 and a second portion 162 that is located at a non-parallel angle with respect to the first portion 160, wherein the ball-and-socket 114 is located at the second portion 162. In embodiments, the non-parallel angle is configured such that the first portion 160 is parallel to and offset from the baseplate when the support arm 113 is configured in the second configuration (shown in FIGS. 10-11) and the second portion 162 is at least partially located in the grooves 1304. Furthermore, the non-parallel angle is configured such that the first portion 160 is perpendicular to the baseplate when the support arm 113 is configured in the first configuration (shown in FIGS. 8-9).

In embodiments, the mounting plate 830 has a shape like the shape of the baseplate 808. Thus, with reference to FIGS. 14 and 15, the mounting plate 830 has a body 1440 and a flange or extension 1442 that complement the body 840 and the extension 842, respectively, of the baseplate 808. The front surface 1502 of the mounting plate 830 is opposite the surface to which the mounting plate 830 is mounted. In embodiments, the front surface 1502 is planar (not shown). In embodiments, the surface of the body 1440 on the front surface 1502 is offset from the surface of the extension 1442 such that the front surface 1502 of the body 1440 of the mounting plate 830 surrounds at least a portion of the extension 842 of the baseplate 808 when mounted thereto.

The back surface 1402 (FIG. 14) of the mounting plate 830 is planar such that it rests against the surface to which the mounting plate 830 is mounted. In embodiments, the mounting plate 830 includes one or more fastener apertures 1404 for receiving fasteners extending through the mounting plate 830 to the surface to which the mounting plate 830 is mounted. Although three fastener apertures 1404 are shown, more or fewer fastener apertures 1404 may be included, and at different locations (such as the extension 1442 of the mounting plate 830).

In embodiments, the mounting plate 830 includes a plate mounting aperture 1406 that allows a fastener to couple with a fastener receiving recess 1206 in the baseplate 808. In embodiments, the fastener receiving recess 1206 is threaded to receive a screw, for example. Other fasteners may be used without departing from the scope hereof.

The front surface 1802 of the removable plate cover 820 may be configured to align flush with the extension 842 when the removable plate cover 820 is coupled with the baseplate 808. In embodiments, the removable plate cover 820 couples to the removable plate cover 820 at either side of the baseplate 808 as shown at FIGS. 20 and 21. The back surface 1902 of the removable plate cover 820 includes a ridge 1904 that is configured to interact with the outer edge of the receiving apertures 1204 (FIG. 12) of the baseplate 808 such that the removable plate cover 820 snap-fits onto the baseplate 808.

In embodiments, the configurable mounting bracket 802 couples with additional or alternative devices other than the camera 105, such as, but not limited to, one or more floodlights, speakers, motion detectors, glass-break sensors, home security devices, and home automation devices.

Changes may be made in the above methods and systems without departing from the scope hereof. It should thus be noted that the matter contained in the above description or shown in the accompanying drawings should be interpreted as illustrative and not in a limiting sense. The following claims are intended to cover all generic and specific features described herein, as well as all statements of the scope of the present method and system, which, as a matter of language, might be said to fall therebetween.

In a first aspect, a device mounting assembly comprises a baseplate having a first surface with a groove in the first surface; and a support arm having a first end and a second end, the first end pivotably coupled to the baseplate at a hinge, the second end including a ball-and-socket joint for coupling to an electronic device; wherein the support arm is selectively positionable within the groove in the first surface of the baseplate.

In certain embodiments of the first aspect, the support arm is pivotable about the hinge at least 270 degrees with respect to the baseplate.

In certain embodiments of the first aspect, the support arm includes a first portion and a second portion that is at a non-parallel angle with respect to the first portion.

In certain embodiments of the first aspect, the non-parallel angle is such that the first portion is parallel to and offset from the baseplate when the support arm is at least partially located within the groove.

In certain embodiments of the first aspect, the non-parallel angle is such that the first portion is perpendicular to the baseplate when the support arm is oriented such that the support arm is not located at least partially within the groove.

In certain embodiments of the first aspect, the baseplate comprises a body portion and an extension portion.

In certain embodiments of the first aspect, the groove is located in the extension portion of the baseplate.

In certain embodiments of the first aspect, the groove is two grooves that are parallel to one another, the support arm includes first and second spaced, parallel, support arm portions that are aligned with, and seat within, the grooves when the support arm and the baseplate are oriented at a first angle relative to one another.

In certain embodiments of the first aspect, the device mounting assembly further comprises a removable baseplate cover.

In certain embodiments of the first aspect, the groove is located on an extension portion of the baseplate, the removable cover is not covering the extension portion when attached to the baseplate.

In certain embodiments of the first aspect, the removable baseplate cover is selectively attachable to each of at least two sides of the baseplate.

In certain embodiments of the first aspect, the baseplate includes at least one fastener aperture, the removable cover covers the at least one fastener aperture when attached to the baseplate.

In certain embodiments of the first aspect, the support arm includes a first and second spaced support arm portions each coupled to the baseplate at the first end, and a connecting support arm portion connecting the first and second support arm portions at the second end.

In certain embodiments of the first aspect, the ball-and-socket joint is located between the first and second support arm portions at the second end.

In a second aspect, a device mounting assembly comprises: a baseplate; a support arm having a first end and a second end, the first end pivotably coupled to the baseplate at a hinge, the support arm being pivotable with respect to the baseplate about the hinge to define a plurality of mounting assembly configurations, the second end including a joint for coupling with an electronic device; and a removable cover configured to selectively couple to each of a first side and a second side of the baseplate to accommodate mounting the bracket in a selected one of the plurality of mounting assembly configurations.

In certain embodiments of the second aspect, the removable cover covers a portion of the baseplate when attached thereto, but is not covering a groove located on a first side of an extension portion of the baseplate, when attached to the baseplate, the support arm is located within the groove when the device mounting assembly occupies one of the plurality of mounting assembly configurations.

In certain embodiments of the second aspect, the groove is two grooves that are parallel to one another, the support arm includes first and second spaced, parallel, support arm portions that are aligned with, and seat within, the grooves when the device mounting assembly occupies the one of the plurality of mounting assembly configurations.

In certain embodiments of the second aspect, the support arm includes a first portion and a second portion that is at a non-parallel angle with respect to the first portion.

In certain embodiments of the second aspect, the non-parallel angle is such that the first portion is parallel to and offset from the baseplate when the support arm is located within the groove.

In certain embodiments of the second aspect, the non-parallel angle is such that the first portion is perpendicular to the baseplate when the support arm is oriented such that the support arm is not located within the groove.

What is claimed is:

1. A device mounting assembly, comprising:
    a baseplate having a first surface with a groove in the first surface;
    a support arm having a first end and a second end, the first end pivotably coupled to the baseplate at a hinge, the second end including a ball-and-socket joint for coupling to an electronic device; and
    a removable baseplate cover;

wherein a portion of the support arm is selectively positionable within the groove in the first surface of the baseplate.

2. The device mounting assembly of claim 1, wherein the support arm is pivotable about the hinge at least 270 degrees with respect to the baseplate.

3. The device mounting assembly of claim 1, the support arm including a first portion and a second portion that is at a non-parallel angle with respect to the first portion.

4. The device mounting assembly of claim 3, the non-parallel angle being such that the first portion is parallel to and offset from the baseplate when the support arm is at least partially located within the groove.

5. The device mounting assembly of claim 3, the non-parallel angle being such that the first portion is perpendicular to the baseplate when the support arm is oriented such that the support arm is not located at least partially within the groove.

6. The device mounting assembly of claim 1, the baseplate comprising a body portion and an extension portion.

7. The device mounting assembly of claim 6, the groove located in the extension portion of the baseplate.

8. The device mounting assembly of claim 1, the groove being two grooves that are parallel to one another, the support arm including first and second spaced, parallel, support arm portions that are aligned with, and seat within, the grooves when the support arm and the baseplate are oriented at a first angle relative to one another.

9. The device mounting assembly of claim 1, the groove located on an extension portion of the baseplate, the removable baseplate cover not covering the extension portion when attached to the baseplate.

10. The device mounting assembly of claim 1, the removable baseplate cover being selectively attachable to each of at least two sides of the baseplate.

11. The device mounting assembly of claim 1, the baseplate including at least one fastener aperture, the removable baseplate cover covering the at least one fastener aperture when attached to the baseplate.

12. The device mounting assembly of claim 1, the support arm including a first and second spaced support arm portions each coupled to the baseplate at the first end, and a connecting support arm portion connecting the first and second support arm portions at the second end.

13. The device mounting assembly of claim 12, the ball-and-socket joint being located between the first and second support arm portions at the second end.

14. A device mounting assembly, comprising:
a baseplate;
a support arm having a first end and a second end, the first end pivotably coupled to the baseplate at a hinge, the support arm being pivotable with respect to the baseplate about the hinge to define a plurality of mounting assembly configurations, the second end including a joint for coupling with an electronic device; and
a removable cover, the removable cover positionable with respect to the baseplate in a first configuration and a second configuration, the removable cover covering a first side of the baseplate in the first configuration and a second side of the baseplate in the second configuration, to accommodate mounting the device mounting assembly in a selected one of the plurality of mounting assembly configurations.

15. The device mounting assembly of claim 14, the removable cover covering a portion of the baseplate when attached thereto, but not covering a groove located on a first side of an extension portion of the baseplate, when attached to the baseplate, the support arm being located within the groove when the device mounting assembly occupies one of the plurality of mounting assembly configurations.

16. The device mounting assembly of claim 15, the groove being two grooves that are parallel to one another, the support arm including first and second spaced, parallel, support arm portions that are aligned with, and seat within, the grooves when the device mounting assembly occupies the one of the plurality of mounting assembly configurations.

17. The device mounting assembly of claim 15, the support arm including a first portion and a second portion that is at a non-parallel angle with respect to the first portion.

18. The device mounting assembly of claim 17, the non-parallel angle being such that the first portion is parallel to and offset from the baseplate when the support arm is located within the groove.

19. The device mounting assembly of claim 17, the non-parallel angle being such that the first portion is perpendicular to the baseplate when the support arm is oriented such that the support arm is not located within the groove.

* * * * *